US006910924B1

(12) United States Patent
Marion et al.

(10) Patent No.: US 6,910,924 B1
(45) Date of Patent: *Jun. 28, 2005

(54) WIRELESS CASS INTERFACE DEVICE

(75) Inventors: Randall L. Marion, St. Charles, MO (US); James J. Cook, Bridgeton, MO (US); Steven Allan Wegener, St. Charles, MO (US); William Frederick Rootz, Chesterfield, MO (US)

(73) Assignee: The Boeing Company, Chicago, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 25 days.

(21) Appl. No.: 10/761,974

(22) Filed: Jan. 20, 2004

(51) Int. Cl.[7] .............................................. H01R 25/00
(52) U.S. Cl. ........................ 439/638; 439/824; 324/761
(58) Field of Search ........................... 439/638, 65, 66; 324/761; 639/824

(56) References Cited

U.S. PATENT DOCUMENTS

| | | | |
|---|---|---|---|
| 5,227,718 A | | 7/1993 | Stowers et al. |
| 5,420,519 A | | 5/1995 | Stowers et al. |
| 5,576,631 A | | 11/1996 | Stowers et al. |
| 6,047,469 A | * | 4/2000 | Luna ........................... 29/830 |
| 6,326,799 B1 | * | 12/2001 | Schein ........................ 324/754 |
| 6,358,095 B1 | | 3/2002 | Rootz et al. |
| 6,547,587 B2 | * | 4/2003 | Hurst et al. .................. 439/532 |
| 6,650,134 B1 | * | 11/2003 | Schein ........................ 324/761 |
| 6,784,675 B2 | * | 8/2004 | Willard ....................... 324/754 |

* cited by examiner

Primary Examiner—Ross Gushi
Assistant Examiner—X. Chung-Trans
(74) Attorney, Agent, or Firm—Thompson Coburn LLP

(57) ABSTRACT

An interface device for interfacing automatic test equipment (ATE) with a unit under test (UUT) comprises at least one general purpose interface (GPI) connector body carrying at least one floating GPI contact, at least one twin access contact (TAC) connector body carrying at least one floating TAC contact, and a printed wiring board (PWB). The GPI contact has a first end and a second end. The first end of the GPI contact is adapted for engagement with a corresponding floating contact of the ATE in a manner to permit electrical communication between the GPI contact and its corresponding ATE contact. The TAC contact has a first end and a second end. The TAC connector body is positioned adjacent to the GPI connector body so that the second end of the GPI contact engages the first end of the TAC contact in a manner to permit electrical communication between the GPI contact and the TAC contact. The PWB has at least one contact pad and at least one surface mount connector for mating with a UUT. The contact pad and the surface mount connector are electrically connected via circuitry carried by the PWB. The contact pad of the PWB is adapted for engagement with the second end of the TAC contact in a manner to permit electrical communication between the contact pad and the TAC contact.

24 Claims, 8 Drawing Sheets

WIRELESS CASS INTERFACE DEVICE

BACKGROUND OF THE INVENTION

The present invention relates generally to electrical adapters, connectors and interface devices for interfacing testing equipment with units under test. More particularly, the present invention relates to an improved interface device for interfacing a unit under test (UUT) to a general purpose interface (GPI) of a diagnostic test station, such as a Consolidated Automated Support System (CASS) station.

The CASS diagnostic test system is a standardized suite of automated military electronics test equipment. It is designed to perform full electronics testing, in the nature of functional tests, calibration, and fault detection and isolation, on defense equipment electronic systems in aircraft, aircraft carriers, submarines and other land, air and sea military assets. Designed to solve problems of unreliability, rapid obsolescence and difficult logistic support, the CASS system provides modularity and flexibility to allow expansion for testing both current and future technologies. The CASS system is deployed in different locations, typically military aircraft electronics development and manufacturing centers, naval air stations and aircraft carriers. It is available in various different configurations, depending on the type of electronic defense equipment being tested.

Use of the CASS system typically occurs after onboard built-in test equipment ("BIT") detects or "flags" a fault in a particular aircraft electronics system. The BIT is typically able to detect faults at the module level of the electronics system, known as the Weapons Replaceable Assembly ("WRA"). Failure data generated by the BIT advises service and maintenance personnel that a failure has occurred within a particular WRA and that testing and repair of that particular module is required.

The WRA modules are assemblies, typically having the external form of military-grade metallic boxes, each containing multiple removable printed circuit boards or cards, called Shop Replaceable Assemblies ("SRAs"). Between 5 and 45 such SRAs are typically located within a particular WRA. The detection of a failure in a selected WRA by an onboard BIT indicates one or more failures in one or more SRAs within that WRA. Although the BIT is occasionally able to detect faults beyond the WRA level to the SRA level, typically, the BIT is only used for fault detection at the WRA level. More precise fault detection at the SRA level is performed by removing the WRA from service and testing the electronic systems within that particular WRA at a CASS station.

The CASS station serves dual purposes in the testing of the WRA and SRA assemblies. First, the CASS station is able to test a WRA as a single electronic system (an intermediate level, or "I-level," test), in greater detail than the BIT test. In particular, the CASS station testing of the WRA as a single electronic system identifies individual SRAs having defective electronic components. The CASS station is then also able to test the SRAs on an individual basis, to detect faults within the actual electronic components making up a particular SRA, such as chips, integrated circuits, resistors, capacitors, etc. (commonly referred to as the "piece parts"). Typically, the CASS station testing is able to identify a small group of individual components (perhaps 5 to 7) or "piece parts," and sometimes a single component, within a particular SRA that is defective and therefore in need of replacement.

Thus, the overall method for repairing detected WRA failures using a CASS station involves first testing a WRA as a single system to determine defective SRAs, removing any defective SRAs from a particular WRA, testing these defective SRAs individually to detect individual defective components, replacing the defective components and reinstalling the repaired SRAs within the WRA. Since the WRA modules are typically removable by hand by disconnecting them from the wiring system of the particular military asset involved, they can be brought to a CASS station for diagnosis, repaired as needed and then reinstalled in the military asset.

Because the CASS system is intended to be a universal testing system for many different types of electronic components, it includes a universal-type electrical-mechanical interface in the nature of a GPI. The GPI is a vertical panel on the front of the CASS station containing over 1400 (typically gold-plated) connection pins of three primary types: (1) power pins, which handle high current, and are typically relatively expensive; (2) small signal or small amperage pins, which are less expensive; and (3) coaxial or "coax" pins, which are relatively expensive.

The CASS station GPI pins are referred to as "female" connectors, which engage a plurality of sockets organized in the form of a connector box, or "interface device" ("ID") that is attached as the "male" connector set onto all or part of the CASS station GPI. The ID is used to provide electrical and mechanical connection between a UUT, which may be a WRA or an SRA, and the 1400+ pins of the CASS station GPI. The individual WRAs removed from military assets for CASS station testing typically include three to five "male" socket connector assemblies typically having between about 10 to 120 sockets that are connected to the CASS station GPI pins in a particular arrangement to accomplish the desired testing functions.

Typically, the ID includes "floating" GPI contacts to prevent bending and premature failure of the contacts. That is, the GPI contacts of the ID are held in their respective connector boxes or connector bodies such that they are moveable axially and/or radially to a small extent, to facilitate mating with connector pins of the CASS GPI, which reduces instances of damage to the pins (e.g., by bending or breaking) during mating.

Conventionally, the ID devices utilize discrete wiring. While discrete wiring permits floating of the ID's GPI contacts, discrete wiring produces variations during manufacture that must be eliminated during validation of the device. Such validation is labor and capital intensive, because both the CASS station (or other automatic test equipment) and a troubleshooter are required. Wiring faults may also include subtle errors, such as inappropriate routing for unshielded conductors, resulting in crosstalk. These and other problems caused by discrete wiring may not exhibit themselves during validation or are induced by shipping stresses, so they become "field failures" that may require costly travel to a customer site and, in any case, result in customer perceptions of poor quality. Moreover, discrete wiring increases part count and fabrication effort, and also makes repeatability (i.e., consistency in performance and operation from device to device) extremely difficult.

In general, the use of a printed wiring board (PWB) provides high reliability and repeatability with reduced production cost. Although the simplicity, reliability and repeatability of a PWB would make the use of PWBs preferable over discrete wiring for the reasons stated above, PWBs have not been used in IDs because the GPI contacts of the ID must be permitted to float and cannot be constrained by attachment (e.g., by soldering) to a rigid member such as PWB. The benefits of a PWB based design have resulted in some GPI contact to PWB connection schemes involving at least some small length of wire (to permit floating of the GPI contacts of the ID), but even such small lengths of wire are undesirable because they result in many of the same problems caused by discrete wiring schemes.

Thus, there is a need to replace discrete wiring in the ID with a PWB, without constraining or otherwise interfering with the floating of the ID's GPI contacts, and without inhibiting overall performance and reliability of the device.

SUMMARY OF THE INVENTION

A wireless interface device of the present invention, for interfacing automatic test equipment (ATE), such as a CASS system, with a UUT, comprises at least one GPI connector body carrying at least one floating GPI contact, at least one twin access contact (TAC) connector body carrying at least one floating TAC contact, and a PWB. The GPI contact has a first end and a second end. The first end of the GPI contact is adapted for engagement with a corresponding floating contact of the ATE in a manner to permit electrical communication between the GPI contact and its corresponding ATE contact. The TAC contact has a first end and a second end. The TAC connector body is positioned adjacent to the GPI connector body so that the second end of the GPI contact engages the first end of the TAC contact in a manner to permit electrical communication between the GPI contact and the TAC contact. The PWB has at least one contact pad and at least one surface mount connector for mating with a UUT. The contact pad and the surface mount connector are electrically connected via circuitry carried by the PWB. The contact pad of the PWB is adapted for engagement with the second end of the TAC contact in a manner to permit electrical communication between the contact pad and the TAC contact.

In another aspect of the present invention, an interface device comprises at least one GPI connector body carrying a plurality of floating GPI contacts, at least one TAC connector body carrying a plurality of floating TAC contacts, and a PWB. Each of said GPI contacts has a first end and a second end. The first end of each GPI contact is adapted for engagement with a corresponding floating contact of the ATE in a manner to permit electrical communication between that GPI contact and its corresponding ATE contact. Each of said TAC contacts has a first end and a second end. The TAC connector body is positioned adjacent to the GPI connector body so that the second end of each GPI contact engages the first end of a corresponding TAC contact in a manner to permit electrical communication between the GPI contact and its corresponding TAC contact. The PWB has a plurality of contact pads and at least one surface mount connector for mating with a UUT. The surface mount connector and at least some of the contact pads are electrically connected via circuitry carried by the PWB. Each of said contact pads is adapted for engagement with the second end of a corresponding TAC contact in a manner to permit electrical communication between the contact pad and its corresponding TAC contact.

In still another aspect of the invention, a connector assembly for an interface device comprises a GPI connector body and a TAC connector body. The GPI connector body has a plurality of holes. Each of the holes in the GPI connector body is sized to receive a GPI contact in a manner that permits limited axial and radial float of the GPI contact relative to the GPI connector body. The TAC connector body also has a plurality of holes. Each of the holes in the TAC connector body is sized to receive a TAC contact in a manner that permits limited axial and radial float of the TAC contact relative to the TAC connector body. The TAC connector body is connected to the GPI connector body in a manner so that each GPI contact engages a corresponding TAC contact in a manner to permit electrical communication between the GPI contact and its corresponding TAC contact.

Other features of the invention will be in part apparent and in part pointed out hereinafter. While the principal advantages and features of the present invention have been described above, a more complete and thorough understanding and appreciation for the invention may be attained by referring to the drawings and detailed description of the preferred embodiments, which follow.

Figure 1:
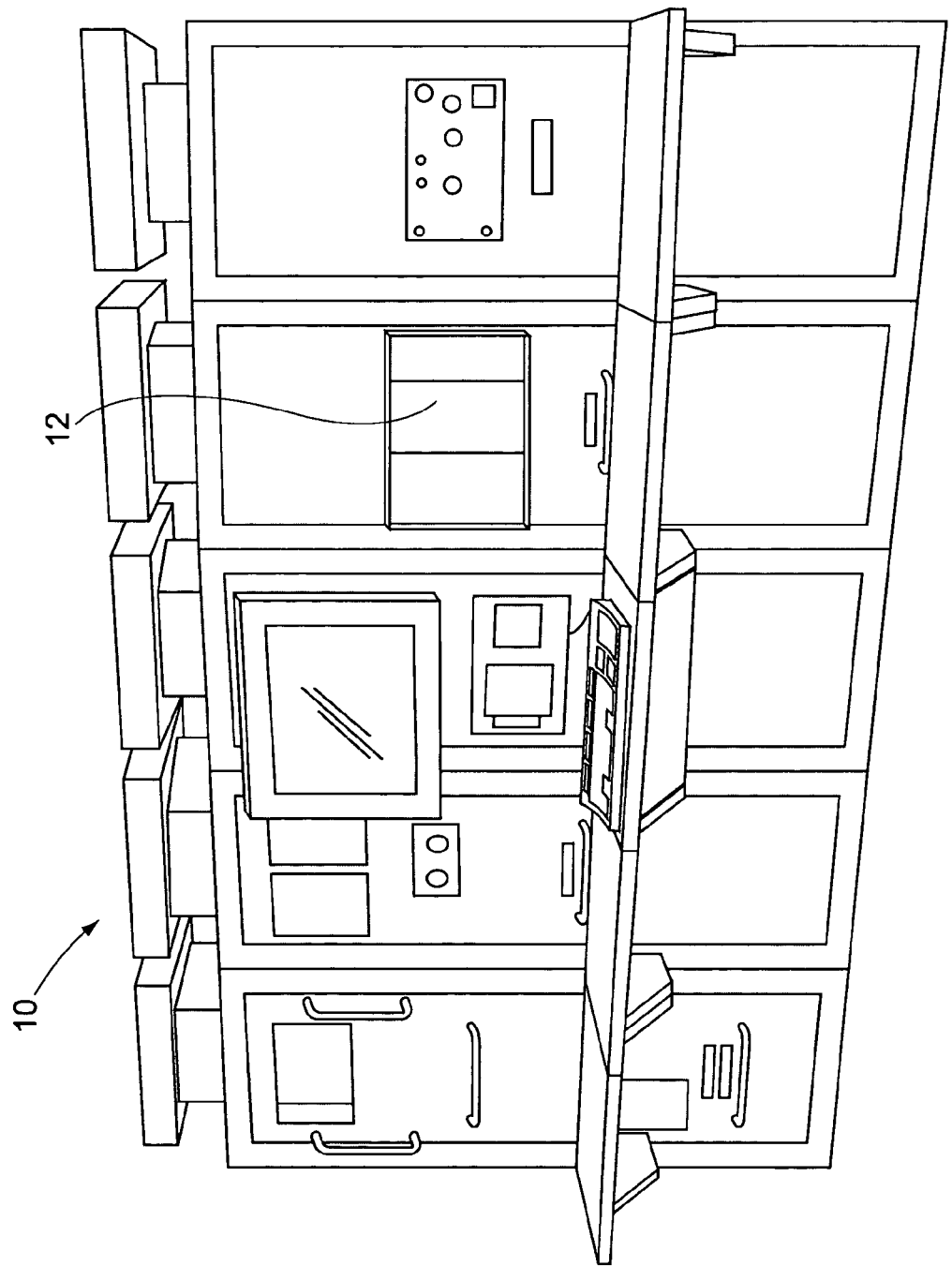
FIG. 1 is a front perspective view illustrating one configuration of a CASS diagnostic test system with which the wireless interface device of the present invention is used.

Reference characters shown in these Figures correspond to reference characters used throughout the following detailed description of the preferred embodiments.

DETAILED DESCRIPTION OF THE PREFERRED EMBODIMENTS

FIG. 1 illustrates one configuration of a CASS diagnostic test system 10 with which the wireless interface device of the present invention is used. While the CASS system is one specific application of the present invention, it should be understood that the present invention is applicable to any ATE utilizing floating pins in the interface device. The CASS station 10 includes a GPI 12 to which a UUT (not shown) can be connected for diagnostic purposes. Preferably, attachment to the GPI 12 is accomplished by direct attachment of an interface device (ID) to the GPI 12.

Figure 2:
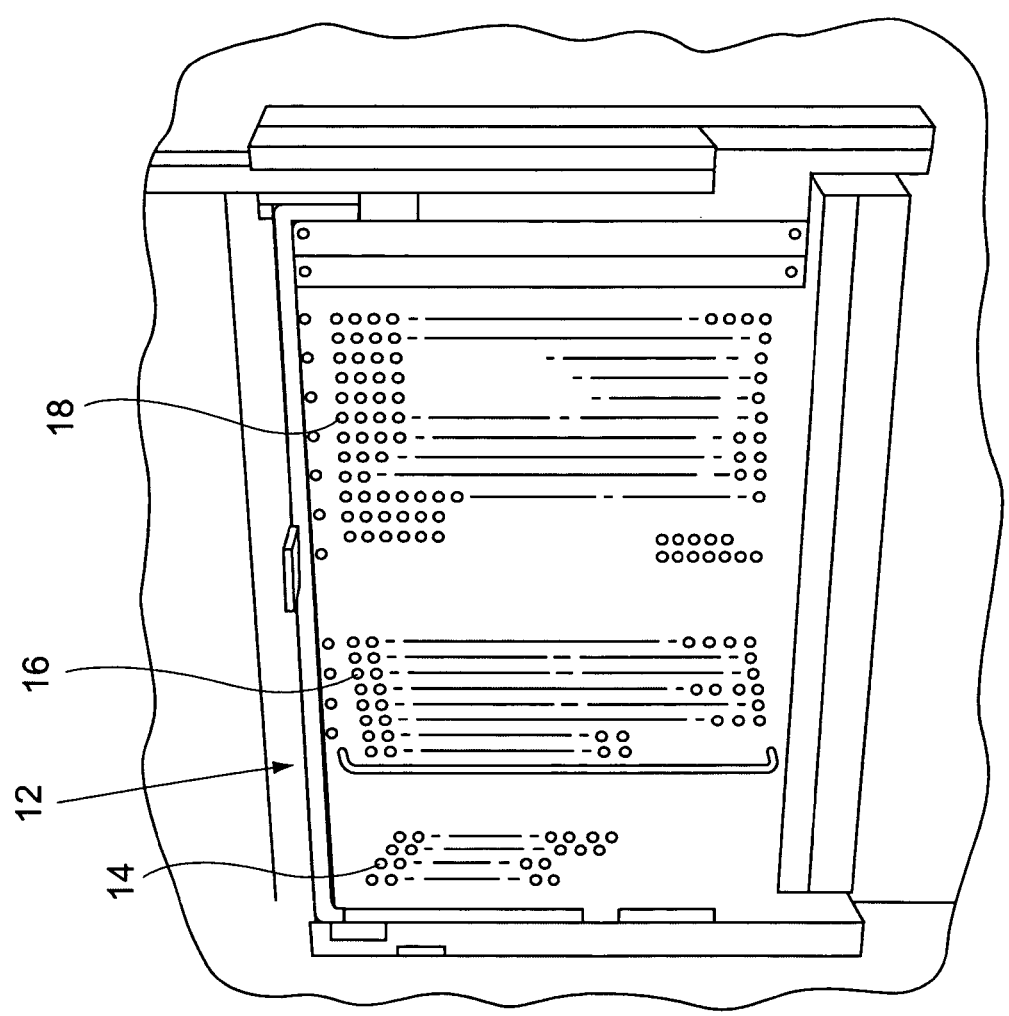
FIG. 2 is a front perspective view illustrating a general purpose interface (GPI) of the CASS system of FIG. 1.

FIG. 2 illustrates the GPI 12 of the CASS system 10 of FIG. 1. In a typical CASS system, the GPI 12 contains over 1400 connection pins of three primary types: power pins 14, small signal pins 16 and coax pins 18. The power pins 14, small signal pins 16 and coax pins 18 are all referred to as "female" connectors in that they engage a plurality of sockets that are typically attached as a "male" connector set onto all or part of the GPI 12.

Figure 3:
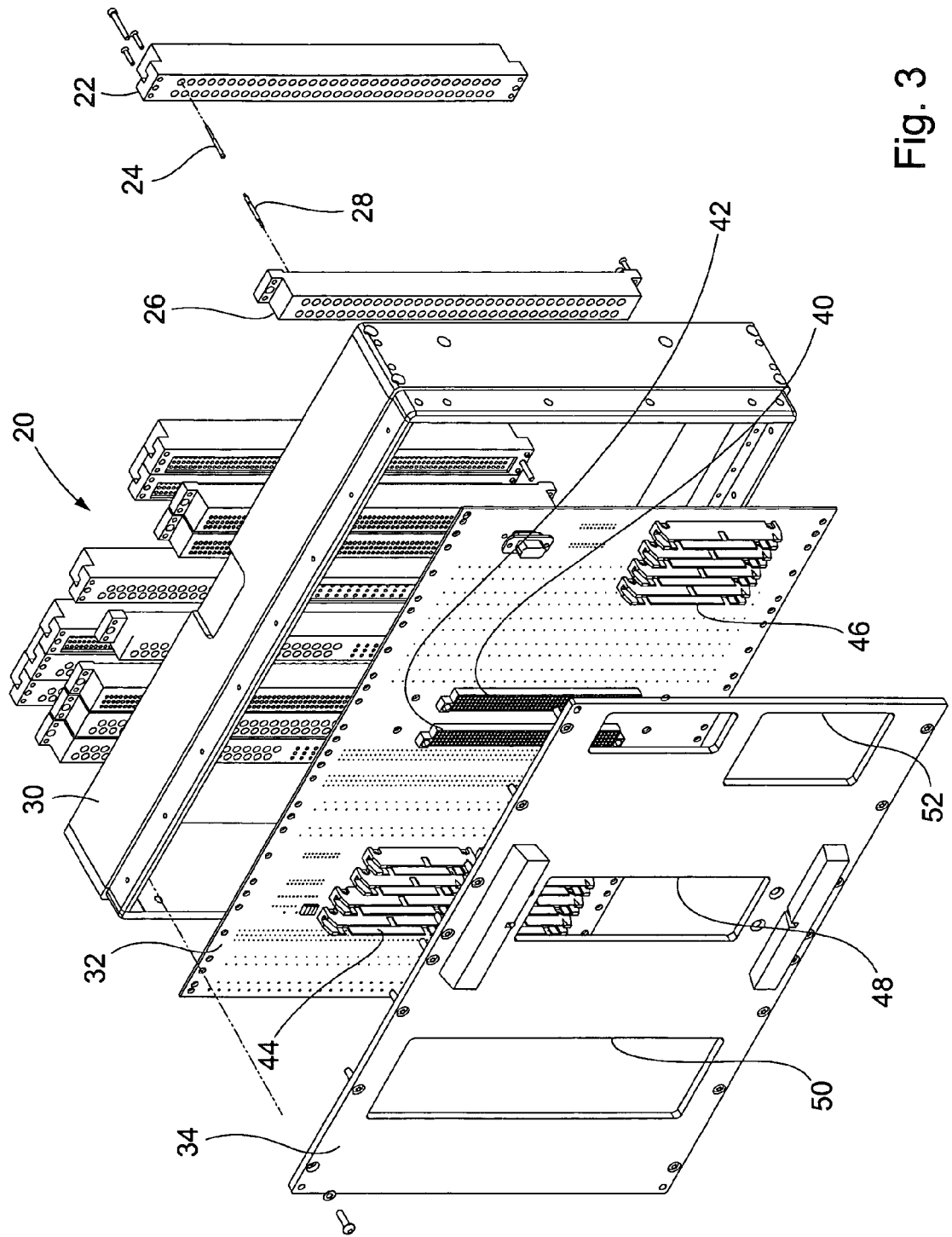
FIG. 3 is an exploded view of a wireless CASS interface device of the present invention.

FIG. 3 is an exploded view of a wireless CASS interface device 20 of the present invention. A GPI connector body 22 is shown furthest to the right in FIG. 3. A single GPI contact 24 is shown exploded from that GPI connector body 22. As explained below, the wireless CASS interface device eliminates intermediate wiring by using twin access contacts (TACs), such as those manufactured by Virginia Panel Corporation. The second major item from the right in FIG. 3 is a TAC connector body 26. A single TAC contact 28 is shown exploded from the TAC connector body 26. The next component to the left or front is the ID frame 30. A PWB 32 is shown to the left or front of the ID frame 30. A stiffener plate 34, used in the preferred embodiment of the invention, is illustrated to the left or front of the PWB 32. This exploded view illustrates the overall arrangement of components of the CASS ID 20, which provides for easy assembly and maintenance.

In the preferred embodiment of the CASS ID 20 shown in FIG. 3, the center connectors 40 and 42 are provided on the PWB 32 for mating with two UUTs (not shown), which may be independently supported by the CASS ID 20. These UUTs may be circuit card assemblies, electronics boxes, or other units. In the preferred embodiment of the CASS ID 20 shown in FIG. 3, the headers 44 and 46 are for test cables (not shown) for interfacing with test connectors on the UUTs.

Preferably, stiffener plate 34 is used to support the PWB 32. Apertures 48, 50 and 52 are provided in the stiffener plate 34 for access to the center connectors 40 and 42 and the headers 44 and 46. The stiffener plate 34 counters the cumulative contact load (typically, about 2 ounces per signal contact, about 7 ounces per coax contact, and about 25 ounces per power contact). If thicker PWBs are used, a stiffener plate may be unnecessary to counter the cumulative contact load. However, extremely thick PWBs tend to make soldering operations more difficult, so the preferred embodiment of the invention incorporates a thinner PWB 32 with a separate stiffener plate 34. In the preferred embodiment, the stiffener plate 34 is constructed of aluminum alloy, though other materials could be used without departing from the scope of the invention. If a conductive stiffener is used, a layer of insulating material (e.g., Mylar tape) may be used to ensure electrical isolation from the PWB 32.

Figure 4:
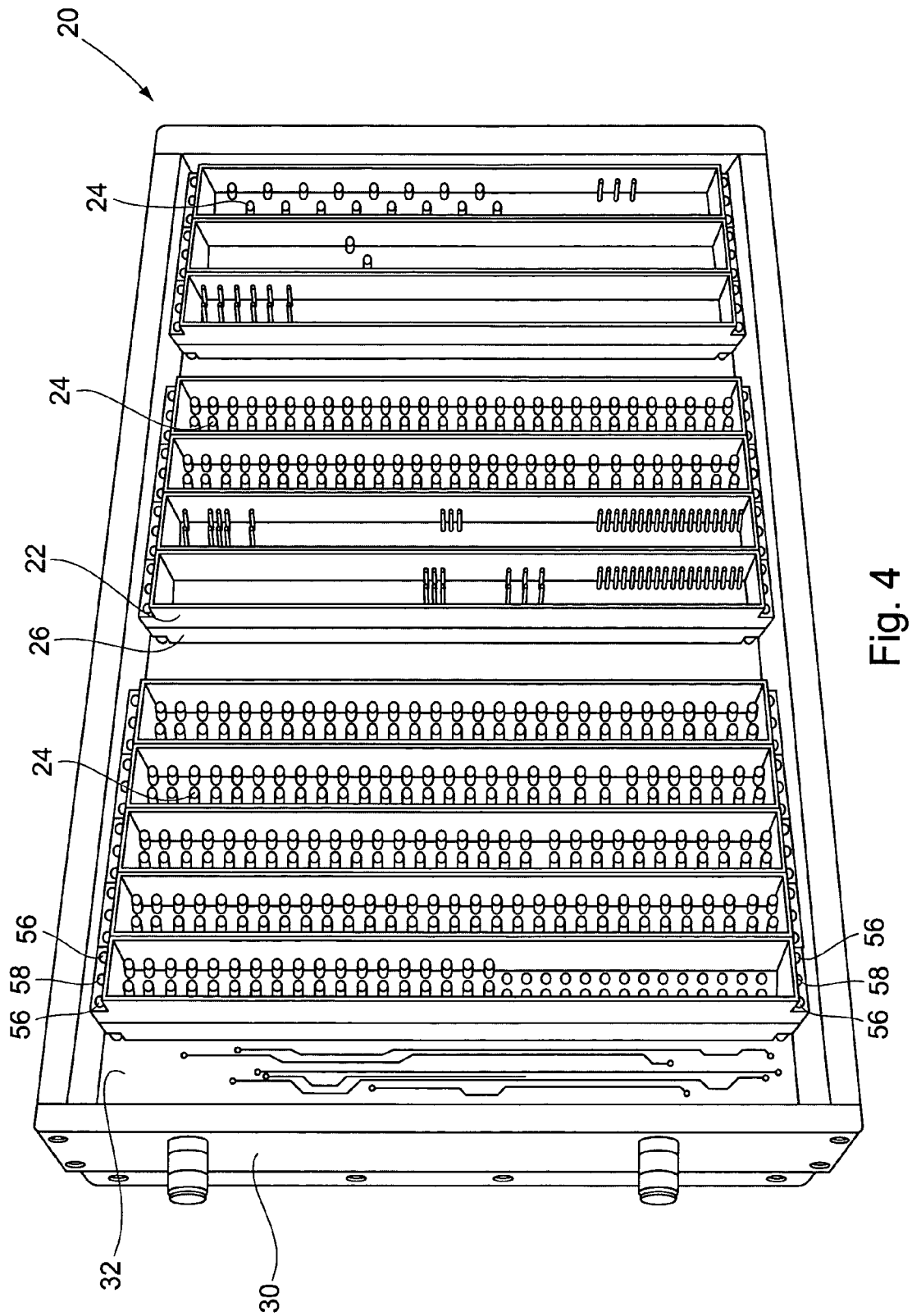
FIG. 4 is a rear perspective view of the wireless CASS interface device of the present invention.

FIG. 4 is a rear view of the CASS ID 20, showing the various contacts and connector bodies in more detail. A plurality of mated GPI connector bodies 22 and TAC connector bodies 26 are shown. Though the example of FIG. 4 shows unoccupied connector slots, all connector slots can be occupied by mated connector bodies. Bolts or other mechanical fasteners 56, for holding the mated connector bodies 22 and 26 together and for securing them to the PWB 32 and stiffener plate 34, are evident across the top and bottom. Removal of a mated connector body only requires removal of these bolts 56. Thus, repair time for a bent or broken GPI contact is reduced to a matter of a few minutes.

Figure 5:
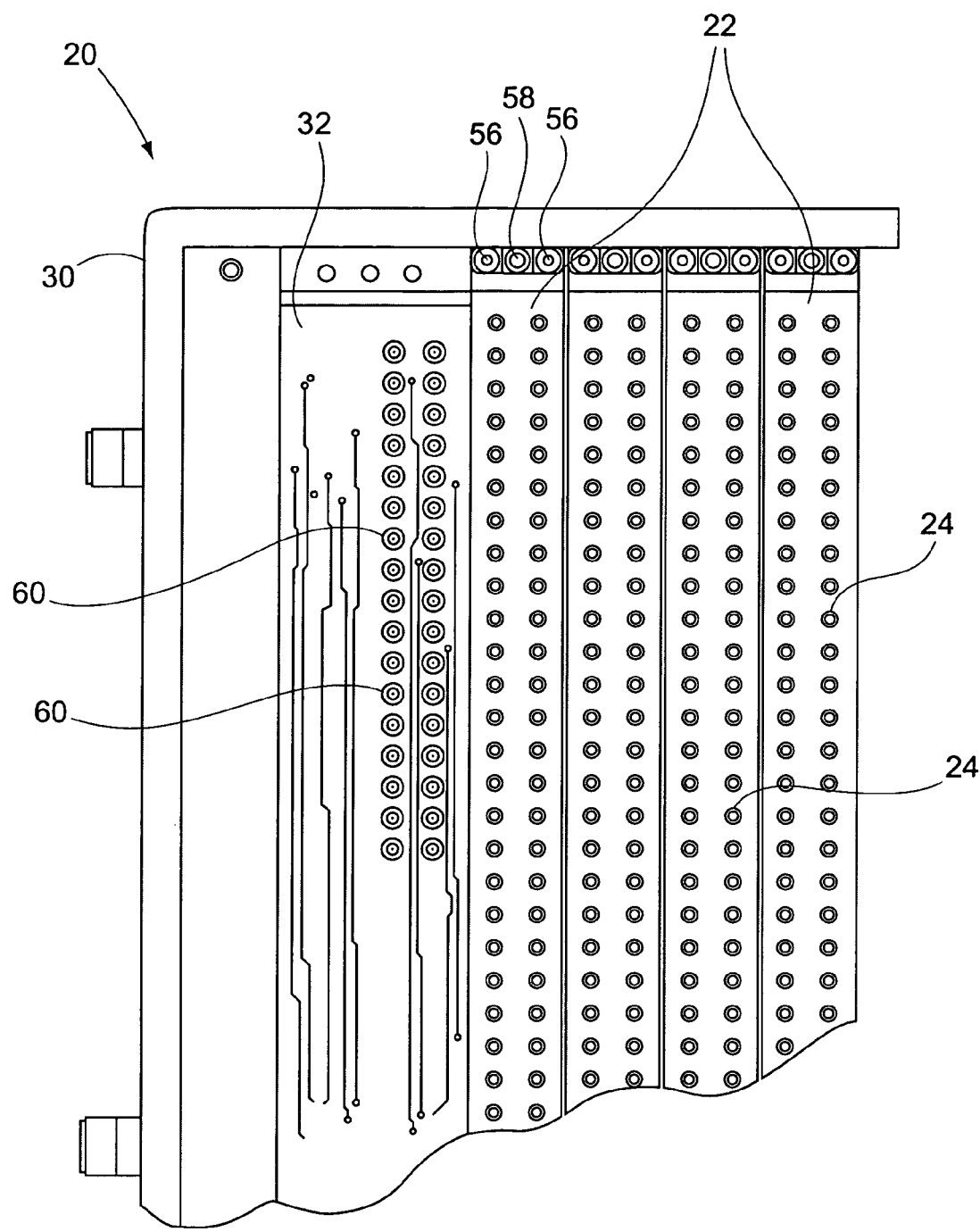
FIG. 5 is a partial rear elevational view of the wireless CASS interface device of FIG. 4.

FIG. 5 is a partial rear view of the CASS ID 20, with one mated connector body removed to show contact pads 60 on the rear side (TAC side) of the PWB 32. The contact pads 60 and surface mount connectors 40, 42, 44 and 46 are electrically connected via circuitry carried by the PWB 32. As explained hereinafter, these contact pads are adapted for engagement with TAC contacts. Preferably, the PWB 32 construction is industry standard for surface mount components. Solder mask or non-etched marking should not be used on the rear side of the PWB 32. Preferably, the contact pads 60 are gold plated per MIL-G-45204, Type 1, Grade C, 0.000120 minimum thickness over nickel plated per QQ-N-290, Class 2, 0.000150 minimum thickness. However, contact pads having other specifications could be utilized without departing from the scope of the present invention, as claimed.

All of these components mount within the confines of a standard ID frame. The compact arrangement minimizes storage volume. The ID frame 30 used in the present invention is essentially a standard ID frame, with some slight mechanical modifications to the upper and lower ribs of the frame 30, to accommodate for mounting of the PWB 32 and stiffener plate 34. Specifically, rib depth was increased slightly to provide a proper distance between the TAC contacts and the PWB 32. Additional mounting holes were also added to attach the PWB 32 and stiffener plate 34 to the frame 30. Also, use of the stiffener plate 34 eliminates the need for an enclosure on the front side of the device.

Figure 6:
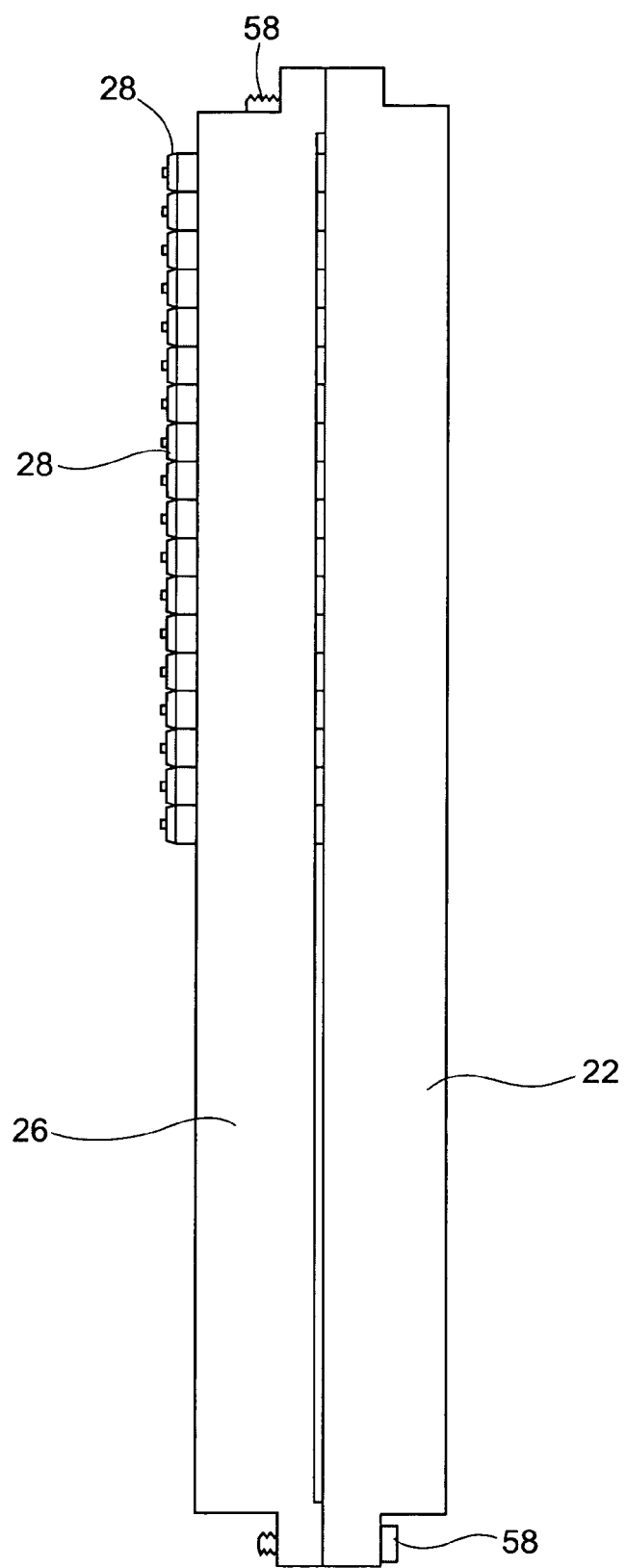
FIG. 6 is a side elevational view of a twin access contact (TAC) connector body and a GPI connector body connected to one another, as used in the wireless CASS interface device of the present invention.
Figure 7:
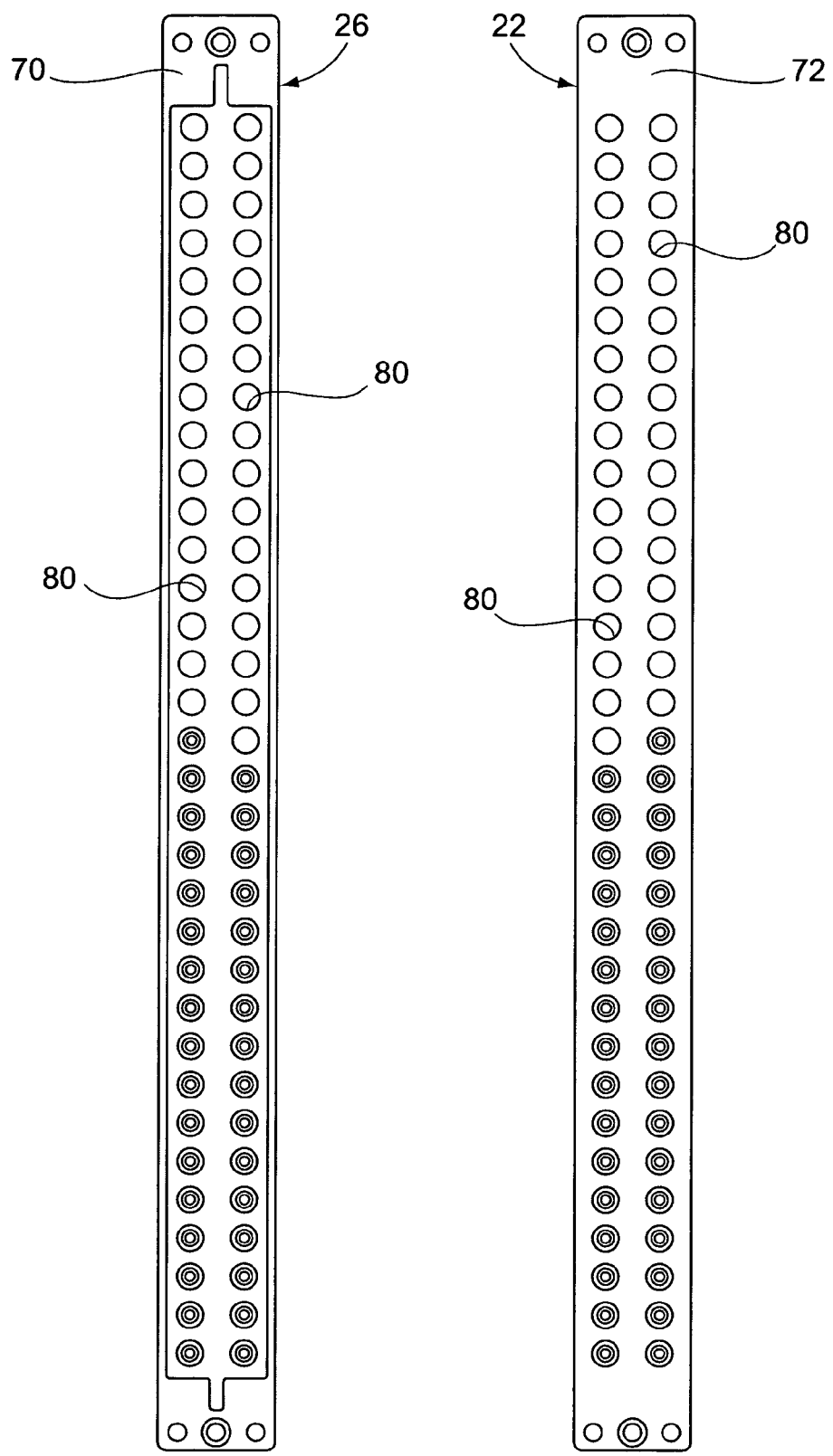
FIG. 7 is an elevational view of the mating surfaces of the TAC and GPI connector bodies.

FIG. 6 is a side view of a TAC connector body 26 and a GPI connector body 22 mated with one another. In FIG. 7, the connector bodies 22 and 26 are disassembled to show their mating surfaces 70 and 72. The connector bodies 22 and 26 include a plurality of holes 80 for receiving the contacts (which are described in more detail hereinafter). Each of the holes in the GPI connector body 22 is preferably sized to receive a GPI contact in a manner that permits limited axial and radial "float" of the GPI contact relative to the GPI connector body 22. Similarly, each of the holes in the TAC connector body 26 is sized to receive a TAC contact in a manner that permits limited axial and radial "float" of the TAC contact relative to the TAC connector body 26.

The TAC contacts are retained in the mated connector body, but freely removed when the TAC connector body 26 is separated from the GPI connector body 22. All contacts are independently replaceable with no soldering, crimping or wire wrap operations. Disassembly is preferably performed with the TAC connector body 26 on the bottom to prevent the contacts from inadvertently falling out. Fasteners 58 preferably insert from the GPI connector body side, so putting the TAC connector body 26 on the bottom for disassembly is the logical arrangement. The GPI connector bodies 22 are very similar to stock connector bodies except that holes 74 have been added to receive fasteners 58 for attachment to the TAC connector bodies 26. The mated GPI and TAC connector bodies then attach to the GPI frame with two bolts 56 in the same fashion as the standard GPI connector bodies.

Figure 8A:
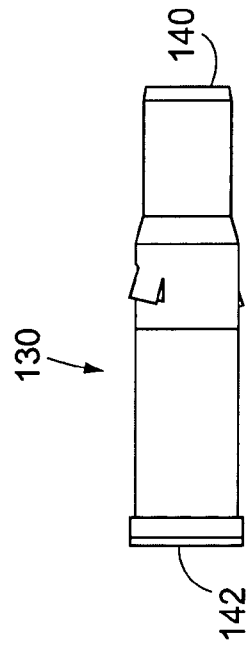
FIG. 8a is a side elevational view of a TAC power contact.
Figure 8B:
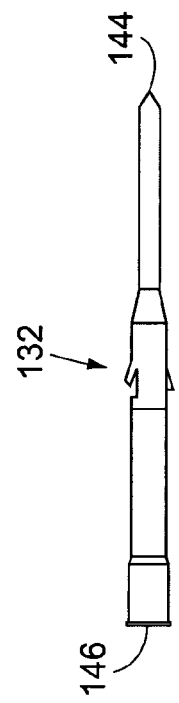
FIG. 8b is a side elevational view of a TAC signal contact.
Figure 8C:
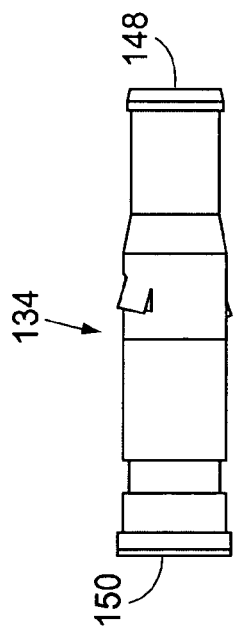
FIG. 8c is a side elevational view of a TAC coaxial contact.

FIGS. 8a through 8f show the TAC and GPI contacts in greater detail. FIG. 8a is a side view of a TAC power contact 100, FIG. 8b is a side view of a TAC signal contact 102, and FIG. 8c is a side view of a TAC coax contact 104. Preferably, the TAC contacts 100, 102 and 104 are the standard contacts manufactured by Virginia Panel Corporation and used in Virginia Panel Corporation's Gemini™ interface products. Preferably, each TAC contact comprises a generally cylindrical barrel 105, a first plunger 106 and a second plunger 107. The first and second plungers 106 and 107 are slidable axially relative to the barrel 105 (preferably, substantially independently from one another) and are spring biased axially outwardly from one another so that the first and second ends of each TAC contact are correspondingly biased axially outwardly from one another. A small raised ring 109 is provide on the center barrel 105 of each of the contacts 100, 102 and 104 for retaining the contacts in the TAC connector body 26. These rings 109 are off-center, to ensure that the contacts are inserted in one direction only, although they appear symmetrical in virtually all other respects.

Each TAC power contact 100 has a first end 110 adapted for engagement with a corresponding GPI contact and a second end 112 adapted for engagement with a contact pad 60 of the PWB 32. Similarly, each TAC signal contact 102 has a first end 114 and a second end 116, and each TAC coax contact 104 has a first end 118 and a second end 120. Preferably, the contact pads 60 of the PWB 32 each have a generally planar contact surface, which is adapted for abutting engagement with the second end of each TAC contact in a manner to permit radially sliding movement of the TAC contact relative to the contact pad 60 of the PWB 32 while maintaining electrical communication therebetween.

Helical keys (not shown) are provided internally in the TAC coax contacts 104 and TAC signal contacts 102 to ensure wiping action by twisting the contacts when compressed at mating of the CASS ID 20 with the GPI 12 of the CASS system 10. The contacts are wiped with each station mating and not just at assembly time, because the GPI contacts (described below) move axially at mating. The TAC power contacts 100 do not incorporate the helical key feature, but. The large diameter and center dimple (not shown) of the TAC power contacts 100 does ensure some degree of wiping action during mating as the contacts 100 settle. This wiping helps to ensure a good electrical connection between the TAC contacts and the contact pads 60 on the PWB 32, as well as between the TAC contacts and GPI contacts, which are discussed below.

Figure 8D:
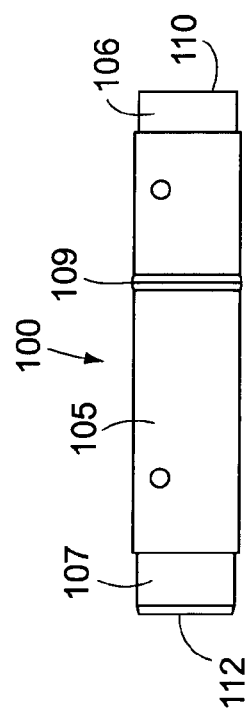
FIG. 8d is a side elevational view of a GPI power contact used in the wireless CASS interface device of the present invention.
Figure 8E:
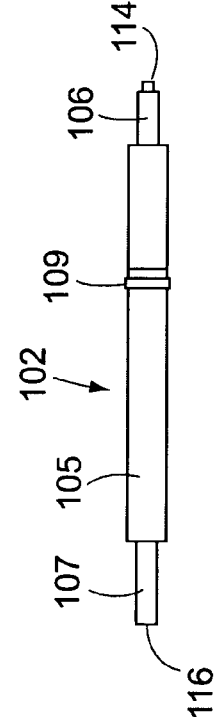
FIG. 8e is a side elevational view of a GPI signal contact used in the wireless CASS interface device of the present invention.
Figure 8F:
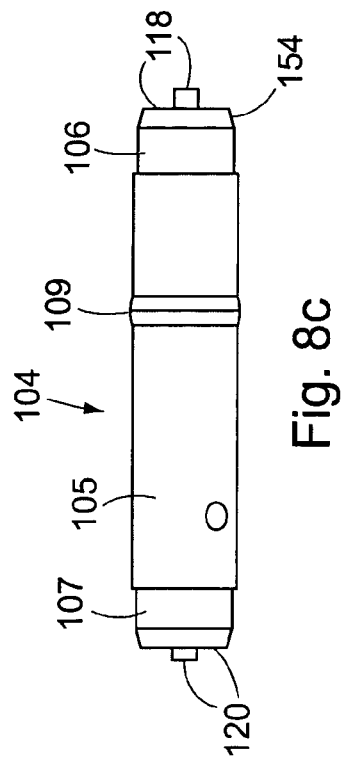
FIG. 8f is a side elevational view of a GPI coaxial contact used in the wireless CASS interface device of the present invention.

FIG. 8d is a side view of a GPI power contact 130, FIG. 8e is a side view of a GPI signal contact 132, and FIG. 8f is a side view of a GPI coax contact 134. Each GPI power contact 130 has a first end 140 adapted to mate with a corresponding contact pin in the GPI 12 of the CASS system 20 and a second end 142 adapted for engagement with a corresponding TAC contact. Similarly, each GPI signal contact 132 has a first end 144 and a second end 146, and each GPI coax contact 134 has a first end 148 and a second end 150. The GPI contacts 130, 132 and 134 are similar to standard CASS GPI contacts, except that the second end 142 of the GPI power contact 130 and the second end 146 of the GPI signal contacts 132 are flattened surfaces. As shown in FIG. 8c, the TAC coax contacts 104 include a beveled surface 154 on the outside of the outer conductor, and the GPI coax contacts 134 are correspondingly beveled on the inside of the outer conductor. The inner conductors at the second end 150 of each of the GPI coax contacts 134 are also flat. As shown in FIGS. 8d, 8e and 8f, each GPI contact extends generally along an axis between its first and second ends. The flattened surface at the second end 142 of each GPI power contact 130 and the flattened surface at the second end 146 of each GPI signal contact 132 is a generally planar contact surface that is substantially perpendicular to the axes along which the GPI contacts extend. These planar contact surfaces at the second ends of the GPI contacts are adapted for abutting engagement with the first end a corresponding TAC contact in a manner to permit radially sliding movement or "float" of the GPI contacts relative to the TAC contacts while maintaining electrical communication therebetween. Preferably, the flattened contact surfaces at the second end of each GPI contact has a diameter that is at least 75% of a diameter of the first end of the corresponding TAC contact. Aside from these flattened and beveled surfaces, the GPI contacts 130, 132 and 134 are similar to standard CASS GPI contacts.

In use, an CASS ID 20 of the present invention comprises a plurality of GPI connector bodies 22 mated with a corresponding number of TAC connector bodies 26. Each GPI connector body 22 carries a plurality of floating GPI contacts 130, 132 and/or 134, and each TAC connector body 26 carries a corresponding number of TAC contacts 100, 102 and 104. The first end of each GPI contact 130, 132 and 134 is adapted for engagement with a corresponding contact of the CASS system GPI 12 in a manner to permit electrical communication between the GPI contacts 130, 132 and 134 and their corresponding CASS system contacts. The TAC connector bodies 26 are positioned adjacent to the GPI connector bodies 22 so that the flattened surface at the second end of each of the GPI contacts 130, 132 and 134 engages the first end of its corresponding TAC contact 100, 102 and 104 in a manner to permit electrical communication between the GPI contact and the TAC contact. The PWB 32 includes a plurality of contact pads 60, each being adapted for engagement with the second end of a TAC contact 100, 102 or 104 in a manner to permit electrical communication between the contact pad 60 and the TAC contact.

Thus, the use of Virginia Panel Corporation TAC contacts 100, 102 and 104, in lieu of intermediate wiring, provides for three-dimensional float for the GPI contacts 130, 132 and 134. The flattened surfaces at the second end of each GPI contact and the flat TAC contact areas allow for radial movement or "float" of the GPI contacts during mating with the CASS system GPI 12, and spring loading of the contacts allows for axial movement or "float" of the GPI contacts.

As various changes could be made in the above constructions and methods without departing from the scope of the invention, it is intended that all matter contained in the above description or shown in the accompanying drawings shall be interpreted as illustrative and not in a limiting sense. The invention therefore shall be limited solely by the scope of the claims set forth below.

What is claimed is:

1. An interface device for interfacing automatic test equipment (ATE) with a unit under test (UUT), the interface device comprising:
   at least one GPI connector body carrying at least one floating GPI contact, the GPI contact having a first end and a second end, the first end of the GPI contact being adapted for engagement with a corresponding contact of the ATE in a manner to permit electrical communication between the GPI contact and its corresponding ATE contact;
   at least one twin access contact (TAC) connector body carrying at least one floating TAC contact, the TAC contact having a first end and a second end, the TAC connector body being positioned adjacent to the GPI connector body so that the second end of the GPI contact engages the first end of the TAC contact in a manner to permit electrical communication between the GPI contact and the TAC contact; and
   a printed wiring board (PWB) having at least one contact pad and at least one surface mount connector for mating with a UUT, the contact pad and the surface mount connector being electrically connected via circuitry carried by the PWB, the contact pad being adapted for engagement with the second end of the TAC contact in a manner to permit electrical communication between the contact pad and the TAC contact.

2. The interface device of claim 1 wherein the TAC contact comprises a first portion and a second portion between its first and second ends, the second portion being slidable axially relative to the first portion, the first and second portions being spring biased axially outwardly from one another so that the first and second ends of the TAC contact are correspondingly biased axially outwardly from one another.

3. The interface device of claim 2 wherein the first portion of the TAC contact comprises a generally cylindrical barrel and the second portion of the TAC contact comprises a first plunger which slides axially within barrel.

4. The interface device of claim 3 wherein the first plunger constitutes the first portion, the barrel constitutes the second portion, and wherein the TAC contact further comprises a second plunger which slides axially within barrel and substantially independently from the first plunger.

5. The interface device of claim 1 wherein the GPI contact extends generally along an axis between its first and second ends, and wherein the second end of the GPI contact includes a generally planar contact surface that is substantially perpendicular to said axis.

6. The interface device of claim 5 wherein the planar contact surface at the second end of the GPI contact is adapted for abutting engagement with the first end of the TAC contact in a manner to permit radially sliding movement of the GPI and TAC contacts relative to one another while maintaining electrical communication therebetween.

7. The interface device of claim 6 wherein the generally planar contact surface at the second end of the GPI contact has a diameter that is at least 75% of a diameter of the first end of the TAC contact.

8. The interface device of claim 1 wherein the at least one contact pad of the PWB has a generally planar contact surface, which is adapted for abutting engagement with the second end of the TAC contact in a manner to permit radially sliding movement of the TAC contact relative to the contact pad of the PWB while maintaining electrical communication therebetween.

9. The interface device of claim 1 wherein the GPI contact comprises one of a power contact, a signal contact and a coaxial contact.

10. The interface device of claim 1 wherein the TAC contact comprises one of a power contact, a signal contact and a coaxial contact.

11. The interface device of claim 1 wherein said at least one GPI connector body carries a plurality of floating GPI contacts, each of said GPI contacts having a first end and a second end, the first end of each GPI contact being adapted for engagement with a corresponding floating contact of the ATE in a manner to permit electrical communication between that GPI contact and its corresponding ATE contact, and wherein said at least one TAC connector body carries a plurality of floating TAC contacts, each of said TAC contacts having a first end and a second end, the TAC connector body being positioned adjacent to the GPI connector body so that the second end of each GPI contact engages the first end of a corresponding TAC contact in a manner to permit electrical communication between the GPI contact and its corresponding TAC contact.

12. The interface device of claim 11 further comprising a rigid, generally planar plate positioned in parallel engagement with the PWB in a manner to reinforce the PWB and counter cumulative axial load generated by the PWB's engagement with the plurality TAC contacts.

13. The interface device of claim 1 wherein the ATE is a Consolidated Automated Support System (CASS) for testing defense equipment electronics systems.

14. An interface device for interfacing automatic test equipment (ATE) with a unit under test (UUT), the interface device comprising:
at least one GPI connector body carrying a plurality of floating GPI contacts, each of said GPI contacts having a first end and a second end, the first end of each GPI contact being adapted for engagement with a corresponding contact of the ATE in a manner to permit electrical communication between that GPI contact and its corresponding ATE contact;
at least one twin access contact (TAC) connector body carrying a plurality of floating TAC contacts, each of said TAC contacts having a first end and a second end, the TAC connector body being positioned adjacent to the GPI connector body so that the second end of each GPI contact engages the first end of a corresponding TAC contact in a manner to permit electrical communication between the GPI contact and its corresponding TAC contact; and
a printed wiring board (PWB) having a plurality of contact pads and at least one surface mount connector for mating with a UUT, the surface mount connector and at least some of the contact pads being electrically connected via circuitry carried by the PWB, each of said contact pads being adapted for engagement with the second end of a corresponding TAC contact in a manner to permit electrical communication between the contact pad and its corresponding TAC contact.

15. The interface device of claim 14 wherein each TAC contact comprises a generally cylindrical barrel, a first plunger at the first end of the TAC contact which slides axially within one end of the barrel, and a second plunger at the second end of the TAC contact which slides axially within an opposite end of the barrel and substantially independently from the first plunger, wherein the first and second plungers are spring biased axially outwardly from one another so that the first and second ends of the TAC contact are correspondingly biased axially outwardly from one another.

16. The interface device of claim 14 wherein each GPI contact extends generally along an axis between its first and second ends, and wherein the second end of each GPI contact includes a generally planar contact surface that is substantially perpendicular to said axis, said planar contact surface being adapted for abutting engagement with the first end of the corresponding TAC contact in a manner to permit radially sliding movement of the GPI and TAC contacts relative to one another while maintaining electrical communication therebetween.

17. The interface device of claim 14 further comprising a rigid, generally planar plate positioned in parallel engagement with the PWB in a manner to reinforce the PWB and counter cumulative axial load generated by the PWB's engagement with the plurality TAC contacts.

18. The interface device of claim 14 wherein the ATE is a Consolidated Automated Support System (CASS) for testing defense equipment electronics systems.

19. A connector assembly for an interface device that a interfaces automatic test equipment (ATE) with a unit under test (UUT), the connector assembly comprising:
a GPI connector body having a plurality of holes, each of said holes being sized to receive a GPI contact in a manner that permits limited axial and radial float of said GPI contact relative to the GPI connector body;
a twin access contact (TAC) connector body having a plurality of holes, each of said holes being sized to receive a TAC contact in a manner that permits limited axial and radial float of said TAC contact relative to the TAC connector body, the TAC connector body being connected to the GPI connector body in a manner so that each GPI contact engages a corresponding TAC contact in a manner to permit electrical communication between the GPI contact and its corresponding TAC contact.

20. The connector assembly of claim 19 wherein each GPI contact has a first end and a second end and extends generally along an axis between its first and second ends, and wherein one of the first and second ends of each GPI contact includes a generally planar contact surface that is substantially perpendicular to said axis.

21. The connector assembly of claim 20 wherein the planar contact surface of each GPI contact is adapted for abutting engagement with an end portion of the corresponding the TAC contact in a manner to permit radially sliding movement of the GPI and TAC contacts relative to one another while maintaining electrical communication therebetween.

22. The connector assembly of claim 21 wherein the generally planar contact surface of each GPI contact has a diameter that is at least 75% of a diameter of the end portion of the corresponding TAC contact.

23. The connector assembly of claim 19 wherein each GPI contact comprises one of a power contact, a signal contact and a coaxial contact.

24. The connector assembly of claim 19 wherein each TAC contact comprises one of a power contact, a signal contact and a coaxial contact.

* * * * *